(12) United States Patent
Chiu et al.

(10) Patent No.: US 8,670,853 B2
(45) Date of Patent: Mar. 11, 2014

(54) ANALOG-TO-DIGITAL CONVERTER, SOUND PROCESSING DEVICE, AND ANALOG-TO-DIGITAL CONVERSION METHOD

(75) Inventors: Jui-Te Chiu, Hsinchu (TW); Ching-Tzung Lin, Nantou (TW)

(73) Assignee: Fortemedia, Inc., Sunnyvale, CA (US)

( * ) Notice: Subject to any disclaimer, the term of this patent is extended or adjusted under 35 U.S.C. 154(b) by 548 days.

(21) Appl. No.: 13/017,446

(22) Filed: Jan. 31, 2011

(65) Prior Publication Data

US 2012/0130517 A1    May 24, 2012

Related U.S. Application Data

(63) Continuation-in-part of application No. 12/950,021, filed on Nov. 19, 2010.

(51) Int. Cl.
*G06F 17/00* (2006.01)
*H04H 40/54* (2008.01)

(52) U.S. Cl.
USPC ............................................... 700/94; 381/7

(58) Field of Classification Search
CPC ...... H04R 3/00; H04R 2410/00; G10L 19/04; G10L 19/18; H03M 3/43
USPC ........... 381/71.13; 700/94; 455/552.1, 73, 91; 375/295
See application file for complete search history.

(56) References Cited

U.S. PATENT DOCUMENTS

| | | | |
|---|---|---|---|
| 7,295,141 B1 | 11/2007 | Wu et al. | |
| 7,385,540 B2 | 6/2008 | Wu et al. | |
| 7,398,102 B2* | 7/2008 | Hidehiro et al. | 455/552.1 |
| 2004/0132488 A1* | 7/2004 | Hidehiro et al. | 455/552.1 |
| 2008/0285770 A1 | 11/2008 | Wu et al. | |
| 2009/0319279 A1* | 12/2009 | Kong et al. | 704/500 |
| 2012/0062405 A1* | 3/2012 | Loeda et al. | 341/143 |

* cited by examiner

*Primary Examiner* — Fan Tsang
*Assistant Examiner* — Eugene Zhao
(74) *Attorney, Agent, or Firm* — McClure, Qualey & Rodack, LLP

(57) ABSTRACT

The invention provides a sound processing device. In one embodiment, the sound processing device comprises a first microphone, a first analog-to-digital converter, a second microphone, and a second analog-to-digital converter. The first microphone detects a first sound pressure to generate a first analog audio signal. The first analog-to-digital converter converts the first analog audio signal from analog to digital to obtain a first digital audio signal. The second microphone detects a second sound pressure to generate a second analog audio signal. The second analog-to-digital converter receives the first digital audio signal and a clock signal, inverts the phase of the first digital audio signal to generate a third digital audio signal, converts the second analog audio signal from analog to digital to obtain a second digital audio signal, encodes a fourth digital audio signal according to the second digital audio signal, outputs data bits of the third digital audio signal when the clock signal oscillates to a logic low level, and outputs data bits of the fourth digital audio signal when the clock signal oscillates to a logic high level.

14 Claims, 8 Drawing Sheets

| CS | Output Data | |
|---|---|---|
| | CLK Low | CLK High |
| 0 | Da | Tri-state |
| 1 | Tri-state | Da |
| Toggle | CS" | Da |

FIG. 6

ANALOG-TO-DIGITAL CONVERTER, SOUND PROCESSING DEVICE, AND ANALOG-TO-DIGITAL CONVERSION METHOD

CROSS REFERENCE TO RELATED APPLICATIONS

This application is a Continuation-In-Part of pending U.S. patent application Ser. No. 12/950,021, filed Nov. 19, 2010 and entitled "Analog-to-digital converter and analog-to-digital conversion method", the entirety of which is incorporated by reference herein.

BACKGROUND OF THE INVENTION

1. Field of the Invention

The invention relates to sound processing, and more particularly to analog-to-digital conversion.

2. Description of the Related Art

Referring to FIG. 1, a schematic diagram of a sound processing device 150 comprising a microphone array is shown. In one embodiment, the sound processing device 150 comprises a plurality of microphone sensors 151~15n, a plurality of the analog-to-digital converters (ADC) 161~16n, and a digital signal processor 170. The microphone sensors 151~15n detect sound pressure at different locations to generate a plurality of analog audio signals Ka~Kn. The analog-to-digital converters 161~16n respectively convert the analog audio signals Ka~Kn from analog-to-digital to obtain a plurality of digital audio signals Da~Dn. The digital signal processor 170 then receives the digital audio signals Da~Dn and processes the digital audio signals Da~Dn to generate an output audio signal I.

To convert the analog audio signals Ka~Kn to digital audio signals Da~Dn, the sound processing device 150 requires the analog-to-digital converters 161~16n to serve as the circuit components thereof. If the analog-to-digital converters 161~16n have an efficient function design, the processing load of the digital signal processor 170 can be lowered. In addition, if the analog-to-digital converters 161~16n have a good output design, it can simplify the circuit integration between the output terminals of the analog-to-digital converters 161~16n and the input terminals of the digital signal processor 170. Thus, an analog-to-digital converter with an efficient design is required.

BRIEF SUMMARY OF THE INVENTION

The invention provides an analog-to-digital converter. In one embodiment, the analog-to-digital converter receives a first audio signal from a microphone sensor, receives a first channel selection signal and a clock signal, and comprises a toggle detection module, a first data processing module, a phase module, a second data processing module, and a multiplexer. The toggle detection module detects whether the first channel selection signal is toggling between a logic low level and a logic high level to generate a control signal. The first data processing module processes the first channel selection signal to generate a second channel selection signal. The phase module inverts the phase of the second channel selection signal to generate a third channel selection signal. The second data processing module converts the first audio signal from analog to digital to generate a second audio signal. If the control signal indicates that the first channel selection signal is toggling between the logic low level and the logic high level, the multiplexer outputs data bits of the third channel selection signal as an output signal of the analog-to-digital converter when the clock signal oscillates to the logic high level, and outputs data bits of the second audio signal as the output signal of the analog-to-digital converter when the clock signal oscillates to the logic low level.

The invention provides a sound processing device. In one embodiment, the sound processing device comprises a first microphone, a first analog-to-digital converter, a second microphone, and a second analog-to-digital converter. The first microphone detects a first sound pressure to generate a first analog audio signal. The first analog-to-digital converter converts the first analog audio signal from analog to digital to obtain a first digital audio signal. The second microphone detects a second sound pressure to generate a second analog audio signal. The second analog-to-digital converter receives the first digital audio signal and a clock signal, inverts the phase of the first digital audio signal to generate a third digital audio signal, converts the second analog audio signal from analog to digital to obtain a second digital audio signal, encodes a fourth digital audio signal according to the second digital audio signal, outputs data bits of the third digital audio signal when the clock signal oscillates to a logic low level, and outputs data bits of the fourth digital audio signal when the clock signal oscillates to a logic high level.

The invention also provides a sound processing device. In one embodiment, the sound processing device receives a clock signal, and comprises a first microphone, a first analog-to-digital converter, a second microphone, and a second analog-to-digital converter. The first microphone detects a first sound pressure to generate a first analog audio signal. The first analog-to-digital converter converts the first analog audio signal from analog to digital to obtain a first digital audio signal, encodes a third digital audio signal according to the first digital audio signal, and outputs data bits of the third digital audio signal as a first output signal when the clock signal oscillates to a logic high level. The second microphone detects a second sound pressure to generate a second analog audio signal. The second analog-to-digital converter converts the second analog audio signal from analog to digital to obtain a second digital audio signal, encodes a fourth digital audio signal according to the second digital audio signal, and outputs data bits of the fourth digital audio signal as a second output signal when the clock signal oscillates to a logic low level. The first output signal and the second output signal are combined to generate an output signal of the sound processing device.

The invention further provides an analog-to-digital conversion method. In one embodiment, an analog-to-digital converter comprises a toggle detection module, a first data processing module, a phase module, a second data processing module, and a multiplexer. First, a first audio signal is received from a microphone sensor. A first channel selection signal and a clock signal are also received. Whether the first channel selection signal is toggling between a logic low level and a logic high level is then detected with a toggle detection module to generate a control signal. The first channel selection signal is then processed with the first data processing module to generate a second channel selection signal. The phase of the second channel selection signal is then inverted to generate a third channel selection signal. The first audio signal is then converted from analog to digital with the second data processing module to generate a second audio signal. If the control signal indicates that the first channel selection signal is toggling between the logic low level and the logic high level, data bits of the third channel selection signal are output with the multiplexer as an output signal of the analog-to-digital converter when the clock signal oscillates to the logic low level, and data bits of the second audio signal are output with the multiplexer as the output signal of the analog-to-digital converter when the clock signal oscillates to the logic high level.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 6 shows output data of an analog-to-digital converter corresponding to different input values of the channel selection signal according to the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
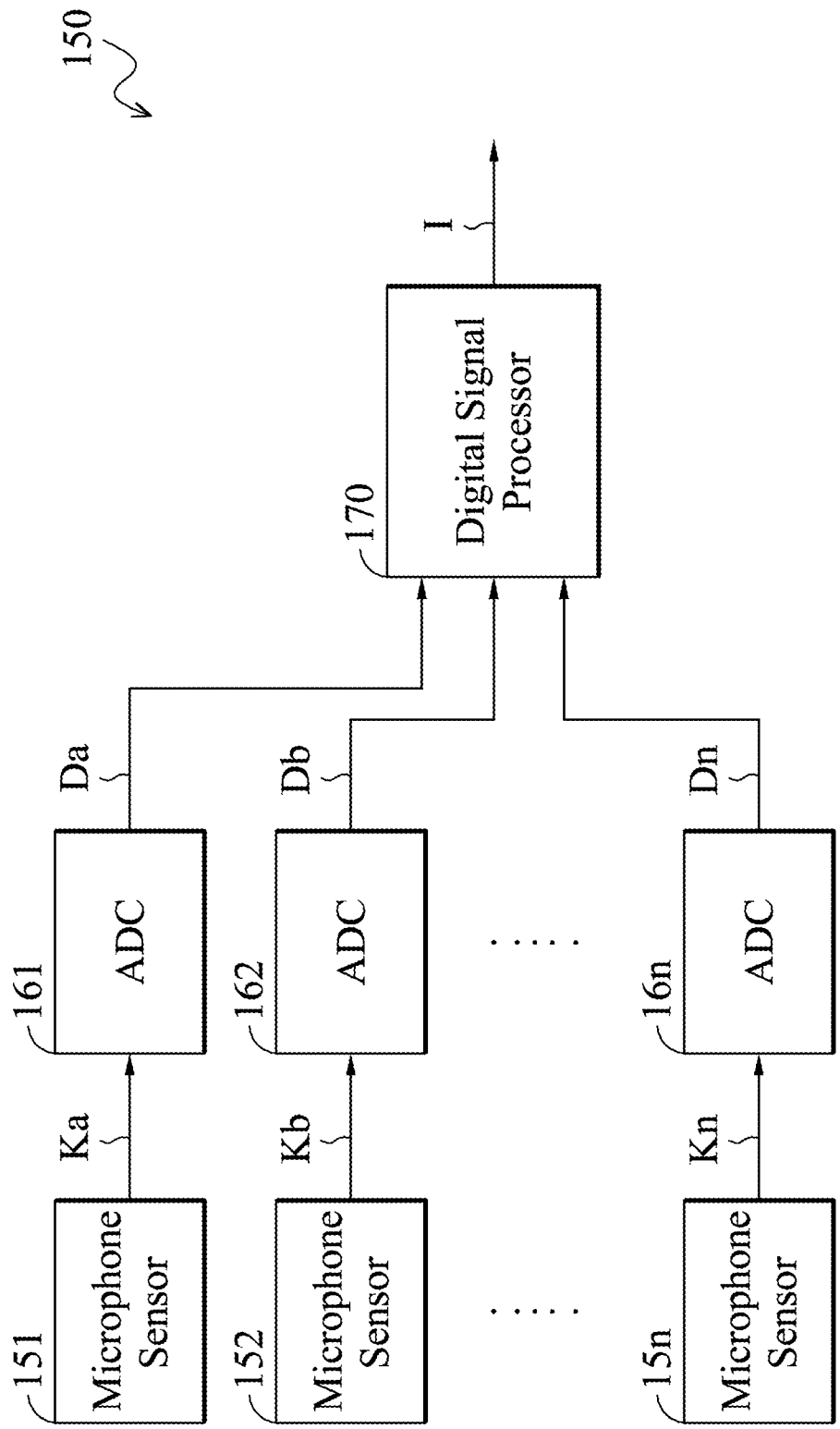
FIG. 1 is a schematic diagram of a sound processing device comprising a microphone array.
Figure 2:
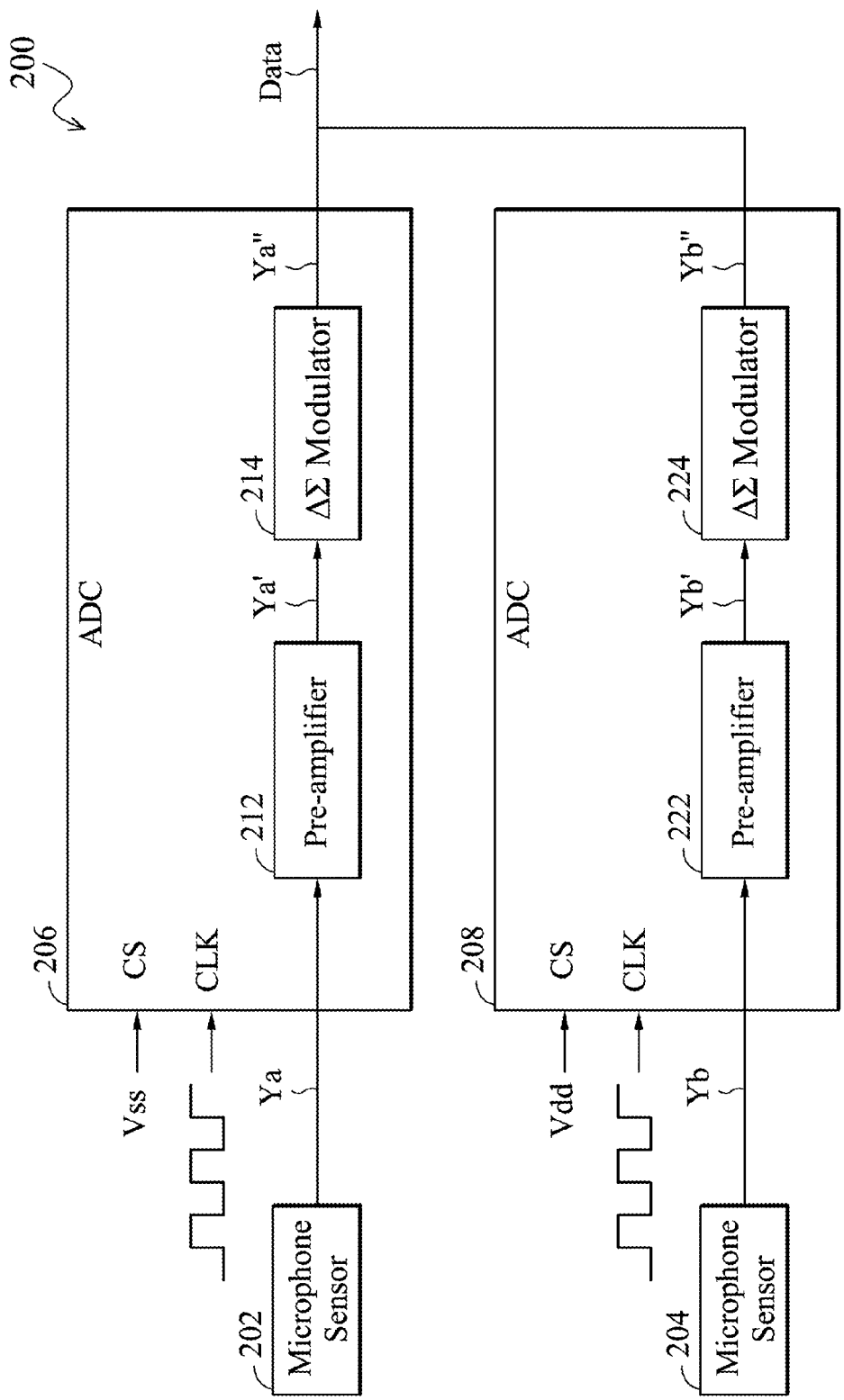
FIG. 2 is a block diagram of a sound processing device.

Referring to FIG. 2, a block diagram of a sound processing device 200 is shown. The sound processing device 200 comprises two microphone sensors 202 and 204 and two analog-to-digital converters 206 and 208. The microphone 202 detects a sound pressure to generate an analog audio signal Ya. The analog-to-digital converter 206 then converts the audio signal Ya from analog to digital to obtain a digital audio signal Ya". Similarly, the microphone 204 detects a sound pressure to generate an analog audio signal Yb. The analog-to-digital converter 208 then converts the audio signal Yb from analog to digital to obtain a digital audio signal Yb".

In one embodiment, the analog-to digital converter 206 comprises a pre-amplifier 212 and a delta-sigma (ΔΣ) modulator 214. The pre-amplifier 212 amplifies the audio signal Ya to obtain an amplified audio signal Ya'. The ΔΣ modulator 214 converts the amplified audio signal Ya' from analog to digital to obtain the digital audio signal Ya". The analog-to-digital converter 214 further receives a channel selection signal CS and a clock signal CLK. The clock signal CLK oscillating between a logic low level and a logic high level. Because the channel selection signal CS of the analog-to-digital converter 206 is coupled to a ground voltage Vss, the analog-to-digital converter 206 outputs data bits of the digital audio signal Ya" when the clock signal CLK oscillates to the logic low level.

Similarly, the analog-to digital converter 208 comprises a pre-amplifier 222 and a ΔΣ modulator 224. The pre-amplifier 222 amplifies the audio signal Yb to obtain an amplified audio signal Yb'. The ΔΣ modulator 224 converts the amplified audio signal Yb' from analog to digital to obtain the digital audio signal Yb". The analog-to-digital converter 224 also receives a channel selection signal CS and a clock signal CLK. The channel selection signal CS of the analog-to-digital converter 208 is coupled to a voltage source Vdd. Thus, the analog-to-digital converter 208 outputs the data bits of the digital audio signal Yb" when the clock signal CLK oscillates to the logic high level. Because the analog-to-digital converters 206 and 208 output the data bits of the digital audio signals Ya" and Yb" respectively during clock periods corresponding to the logic low level and the logic high level, the output data bits of the audio signals Ya" and Yb" are easily combined to obtain an output datastream.

Figure 3:
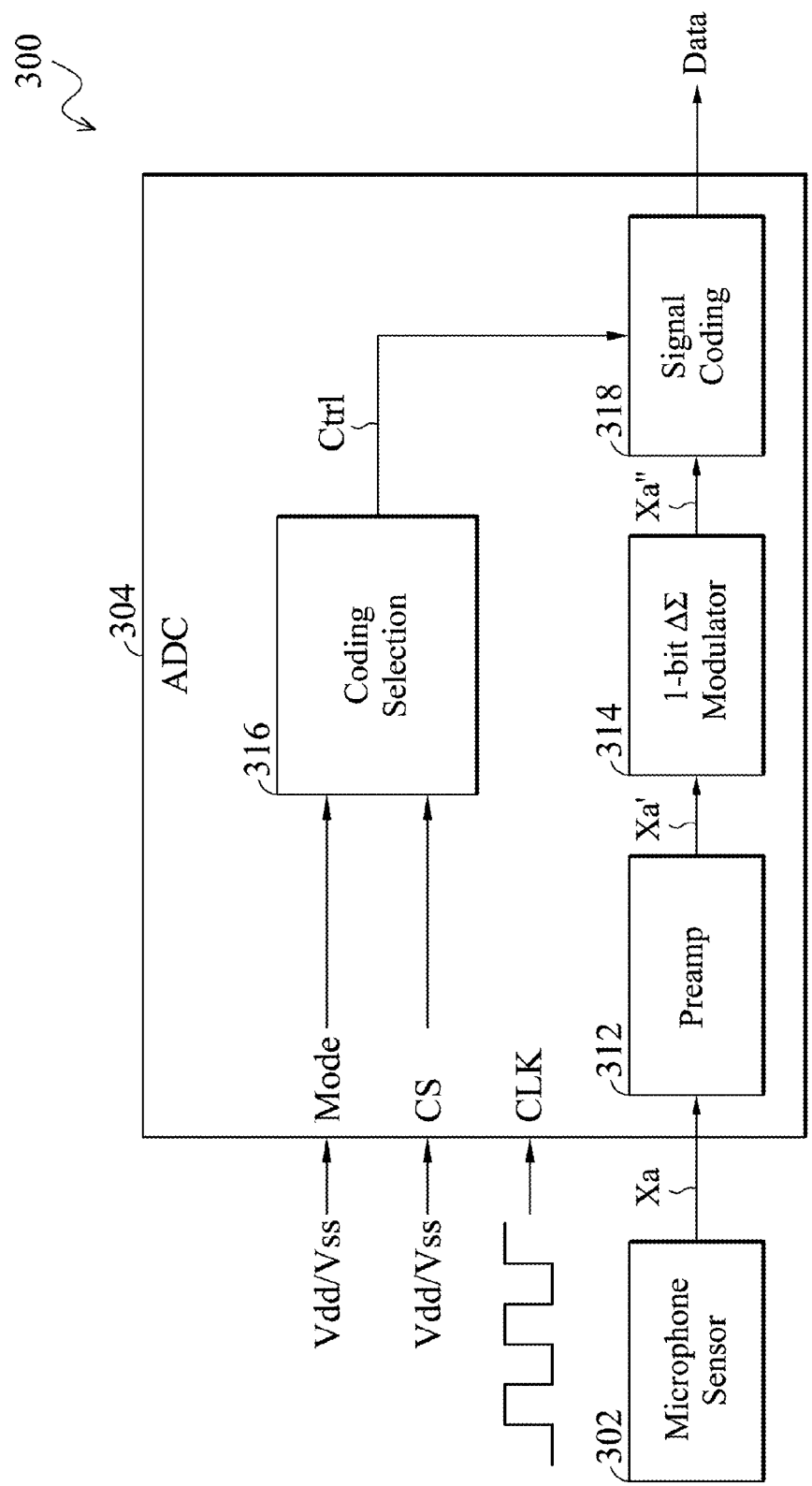
FIG. 3 is a block diagram of an analog-to-digital converter according to the invention.

Referring to FIG. 3, a block diagram of an analog-to-digital converter 304 according to the invention is shown. The analog-to-digital converter (ADC) 304 has four input terminals and an output terminal. Input terminals Mode and CS can be coupled to a voltage source Vdd or a ground voltage Vss. A mode signal and a channel selection signal CS are then respectively obtained via the input terminals Mode and CS. When the input terminal Mode is coupled to the voltage source Vdd, the mode signal is at a logic high level to indicate that an encoding mode has been selected. When the input terminal Mode is coupled to the ground voltage Vss, the mode signal is at a logic low level to indicate that the encoding mode has not been selected. An input terminal CLK receives a clock signal which periodically oscillates between a logic high level and a logic low level. A microphone sensor 302 detects a sound pressure to generate an analog audio signal Xa. The analog-to-digital converter 304 then receives the audio signal Xa from the microphone sensor 302 and processes the analog audio signal Xa according to the mode signal to generate a digital audio signal. The analog-to-digital converter 304 then outputs data of the digital audio signal according to the channel selection signal CS and the clock signal via an output terminal.

In one embodiment, the analog-to-digital converter 304 comprises a pre-amplifier 312, a 1-bit ΔΣ modulator 314, a signal coding module 318, and a coding selection module 316. The pre-amplifier 312 amplifies the analog audio signal Xa to obtain an amplified audio signal Xa'. The 1-bit ΔΣ modulator 314 then converts the amplified audio signal Xa' from analog to digital to obtain a digital audio signal Xa". The coding selection module 316 receives the mode signal and the channel selection signal CS and then generates a control signal Ctrl according to the mode signal and the channel selection signal CS. The control signal Ctrl is then sent to the signal coding module 318. When the control signal Ctrl indicates that the encoding mode has been selected, the signal coding module 318 encodes a coded audio signal according to the digital audio signal Xa" as an output signal of the analog-to-digital converter 304. When the control signal Ctrl indicates that the encoding mode has not been selected, the signal coding module 318 directly forwards the digital audio signal Xa" generated by the 1-bit ΔΣ modulator 314 as an output signal of the analog-to-digital converter 304.

The channel selection signal CS determines a format of the output signal of the analog-to-digital converter 304. When the input terminal CS is coupled to a ground voltage Vss, the channel selection signal CS is at a logic low level. The analog-to-digital converter 304 then outputs data bits of the output signal when the clock signal oscillates to a logic low level, and does not output data bits of the output signal when the clock signal oscillates to a logic high level. In other words, the output terminal of the analog-to-digital converter 304 is switched to a high-impedance state (Z shown in FIG. 4) when the clock signal oscillates to a logic high level. When the input terminal CS is coupled to a voltage source Vdd, the channel selection signal CS is at a logic high level. The analog-todigital converter 304 then outputs data bits of the output signal when the clock signal oscillates to a logic high level, and does not output data bits of the output signal when the clock signal oscillates to a logic low level. In other words, the output terminal of the analog-to-digital converter 304 is switched to a high-impedance state (Z shown in FIG. 4) when the clock signal oscillates to a logic low level.

Figure 4:
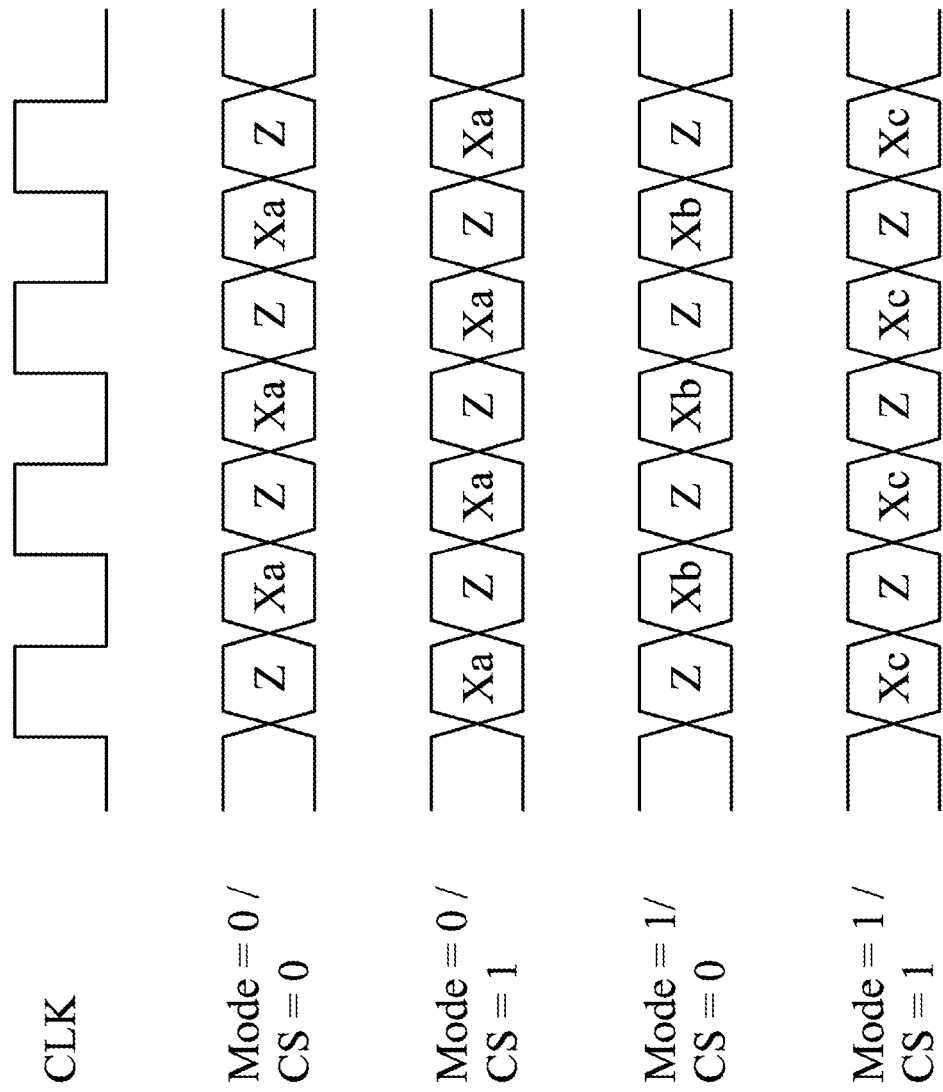
FIG. 4 is a data format diagram of an output signal of an analog-to-digital converter according to the invention.

Referring to FIG. 4, a data format diagram of an output signal of the analog-to-digital converter 304 according to the invention is shown. When the mode signal is at a logic low level, an encoding mode is not selected, and the digital audio signal Xa" generated by the 1-bit ΔΣ modulator 314 is directly taken as an output signal of the analog-to-digital converter 304 without encoding. If the channel selection signal CS is at a logic low level, the analog-to-digital converter 304 outputs data bits of the digital audio signal Xa" when the clock signal is at the logic low level. If the channel selection signal CS is at a logic high level, the analog-to-digital converter 304 outputs data bits of the digital audio signal Xa" when the clock signal is at the logic high level. When the mode signal is at a logic high level, the encoding mode has been selected, and the signal coding module 318 encodes a coded audio signal Xb or Xc as an output signal of the analog-to-digital converter 304. If the channel selection signal CS is at a logic low level, the analog-to-digital converter 304 outputs data bits of the coded audio signal Xb when the clock signal is at the logic low level. If the channel selection signal CS is at a logic high level, the analog-to-digital converter 304 outputs data bits of the coded audio signal Xc when the clock signal is at the logic high level. The signal coding module 318 performs different encoding processes to encode different coded audio signals Xb and Xc when the channel selection signal CS is at different levels.

The signal coding module 318 performs an encoding process in a variety of ways comprising offset adjustment, gain adjustment, phase adjustment, and delay adjustment. In one embodiment, the signal coding module 318 adds a positive offset value to the digital audio signal Xa" to obtain the coded audio signal if the channel selection signal CS is at a logic low level, and the signal coding module 318 adds a negative offset value to the digital audio signal Xa" to obtain the coded audio signal if the channel selection signal CS is at a logic high level. In another embodiment, the signal coding module 318 multiplies the digital audio signal Xa" by a first multiplier to obtain the coded audio signal if the channel selection signal CS is at a logic low level, and the signal coding module 318 multiplies the digital audio signal Xa" by a second multiplier to obtain the coded audio signal if the channel selection signal CS is at a logic high level, wherein the first multiplier is greater than 1 and the second multiplier is smaller than 1.

In another embodiment, the signal coding module 318 does not alter the phase of the digital audio signal Xa" if the channel selection signal CS is at a logic low level, and the signal coding module 318 inverts the phase of the digital audio signal Xa" to obtain the coded audio signal if the channel selection signal CS is at a logic high level. In another embodiment, the signal coding module 314 delays the digital audio signal Xa" to obtain the coded audio signal if the channel selection signal CS is at a logic low level, and the signal coding module 314 does not delay the digital audio signal Xa" if the channel selection signal CS is at a logic high level.

Figure 5:
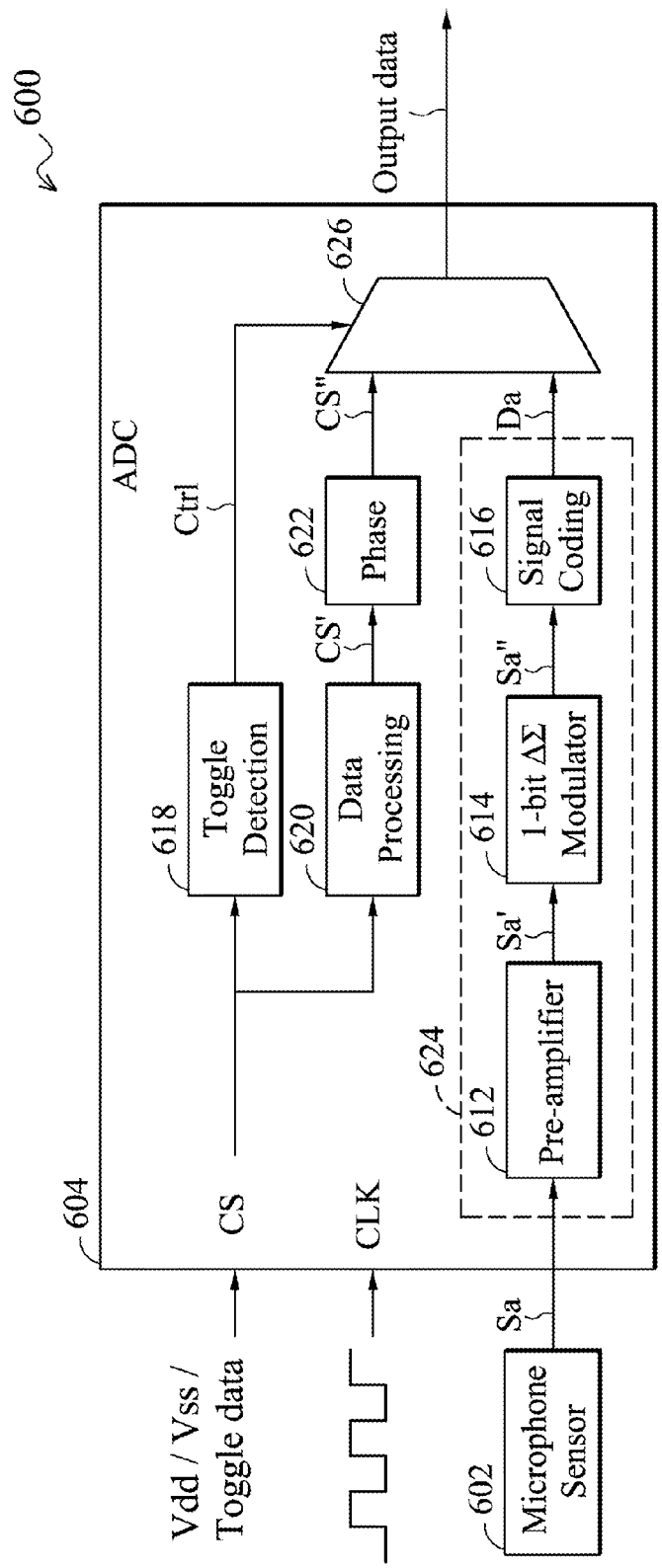
FIG. 5 is a block diagram of an analog-to-digital converter according to the invention.

Referring to FIG. 5, a block diagram of an analog-to-digital converter 604 according to the invention is shown. The analog-to-digital converter 604 has three input terminals. A channel selection terminal CS may be coupled to a voltage source Vdd of a logic high level or a ground voltage Vss of a logic low level. The channel selection terminal CS may also receive a digital data signal toggling between the logic low level and the logic high level. A clock terminal receives a clock signal CLK oscillating between the logic low level and the logic high level. A microphone sensor 602 detects sound pressure to generate an analog audio signal Sa. The analog-to-digital converter 604 then receives the analog audio signal Sa from the microphone sensor 602 and processes the analog-audio signal Sa.

In one embodiment, the analog-to-digital converter 604 comprises a toggle detection module 618, two data processing module 620 and 624, a phase module 622, and a multiplexer 626. A channel selection signal CS received from the channel selection input terminal is sent to both the toggle detection module 618 and the data processing module 620. The toggle detection module 618 determines whether the channel selection signal CS is toggling between a logic high level and a logic low level to generate a control signal Ctrl. If the voltage of the channel selection signal CS switches between the logic low level and the logic high level at a frequency higher than a threshold, the toggle detection module 618 determines that the channel selection signal CS is toggling. Thus, when the channel selection input terminal is coupled to the voltage source Vdd or the ground voltage Vss, the channel selection signal CS stays at the logic high level or the logic low level, and the toggle detection module 618 determines that the channel selection signal CS is not toggling. When the channel selection signal CS is a digital data signal rather than the logic low level of the ground voltage Vss or the logic high level of the voltage source Vdd, the channel selection signal CS changes between the logic low level and the logic high level with the bit values thereof, and the toggle detection module 618 determines that the channel selection signal CS is toggling.

The data processing module 620 processes the channel selection signal CS to generate a processed channel selection signal CS'. The phase module 622 then inverts the phase of the channel selection signal CS to obtain a phase-inverted channel selection signal CS". The data processing module 624 receives the analog audio signal Sa from the microphone sensor 602 and converts the analog audio signal Sa to a digital audio signal Da. In one embodiment, the data processing module 624 comprises a pre-amplifier 612, a 1-bit ΔΣ modulator 614, and a signal coding module 616. The pre-amplifier 612 amplifies the analog audio signal Sa to obtain an amplified audio signal Sa'. The 1-bit ΔΣ modulator 614 then converts the amplified audio signal Sa' from analog to digital to obtain a digital audio signal Sa". The signal coding module 616 then encodes a coded audio signal Da according to the digital audio signal Sa".

The signal coding module 616 encodes the coded audio signal Da according to the digital audio signal Sa" or directly bypasses the digital audio signal Sa" as the coded audio signal Da. When the channel selection signal CS is coupled to the high voltage source Vdd or the ground voltage Vss, the signal coding module 616 directly bypasses the digital audio signal Sa" as the coded audio signal Da without encoding. When the toggle detection module 618 determines that the channel selection signal CS is toggling, the signal coding module 616 encodes the coded audio signal Da according to the digital audio signal Sa". The signal coding module 616 may encode the coded audio signal Da in a variety of ways. In one embodiment, the signal coding module 616 adds a DC offset value to the digital audio signal Sa" to obtain the coded audio signal Da. In another embodiment, the signal coding module 616 multiplies the digital audio signal Sa" by a multiplier value to obtain the coded audio signal Da. In another embodiment, the signal coding module 616 inverts the data bit values of the digital audio signal Sa" to obtain the coded audio signal Da. In another embodiment, the signal coding module 616 delays the digital audio signal Sa" by a delay period to obtain the coded audio signal Da.

The multiplexer 626 then generates an output signal of the analog-to-digital converter 604 according to the control signal Ctrl. Referring to FIG. 6, output data bits of the analog-to-digital converter 604 corresponding to different input values of the channel selection signal CS according to the invention is shown. If the control signal Ctrl indicates that the channel selection signal CS stays at the logic low level, the multiplexer 626 outputs the data bits of the coded audio signal Da when the clock signal CLK oscillates to the logic low level. When the clock signal CLK oscillates to the logic high level, the multiplexer 624 does not output data bits of the coded audio signal Da, and the output terminal of the analog-to-digital converter 604 is switched to a high-impedance state (tri-state). On the contrary, if the control signal Ctrl indicates that the channel selection signal CS stays at the logic high level, the multiplexer 624 outputs the data bits of the coded audio signal Da when the clock signal CLK oscillates to the logic high level. When the clock signal CLK oscillates to the logic low level, the multiplexer 624 does not output data bits of the coded audio signal Da, and the output terminal of the analog-to-digital converter 604 is switched to the high-impedance state. If the control signal Ctrl indicates that the channel selection signal CS is toggling between the logic low level and the logic high level, the multiplexer 624 outputs data bits of the phase-inverted channel selection signal CS" when the clock signal CLK oscillates to the logic low level, and outputs data bits of the coded audio signal Da when the clock signal CLK oscillates to the logic high level.

Figure 7:
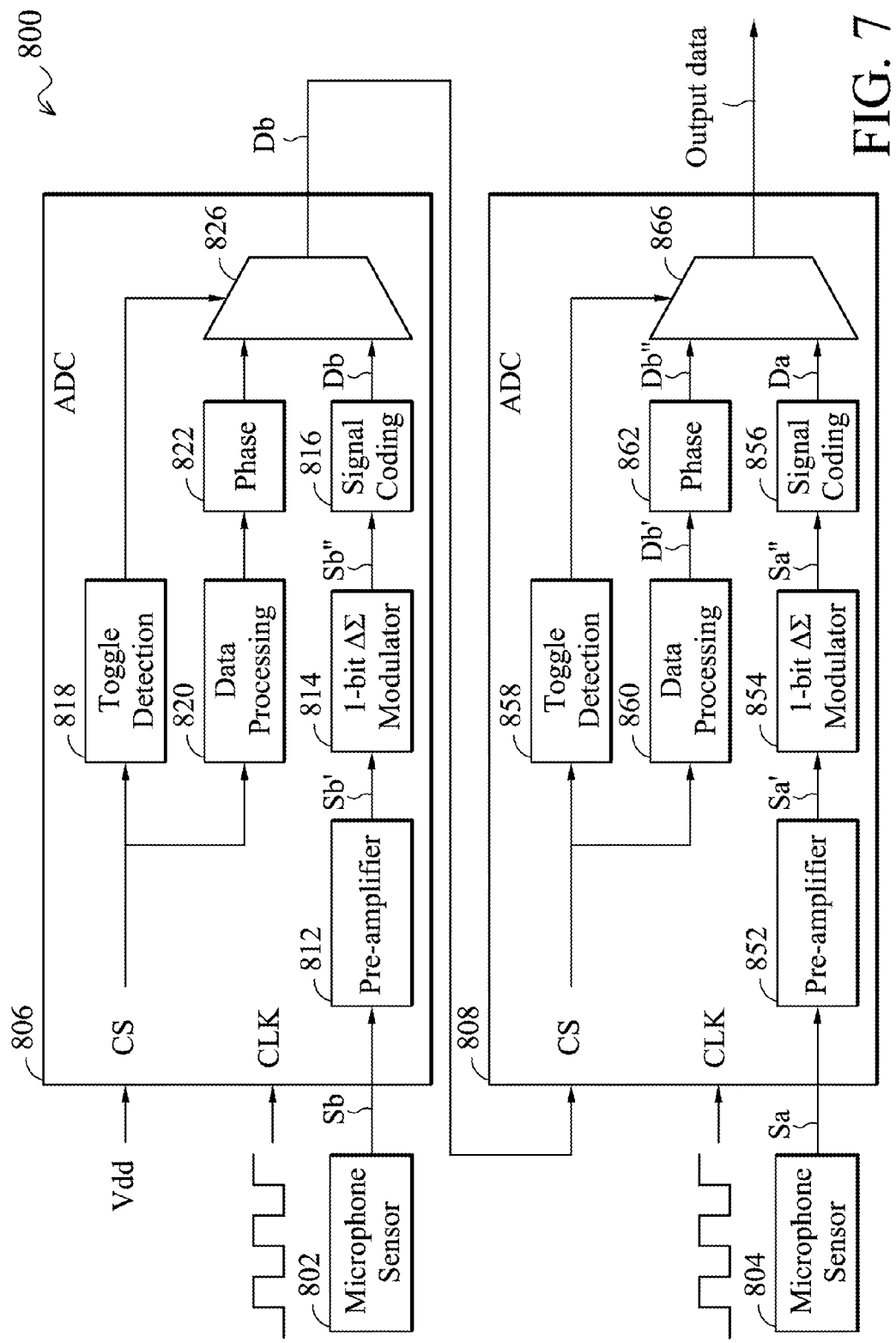
FIG. 7 is a block diagram of an embodiment of a sound processing device according to the invention.

Referring to FIG. 7, a block diagram of an embodiment of a sound processing device 800 according to the invention is shown. In one embodiment, the sound processing device 800 comprises two microphones 802 and 804 and two analog-to-digital converters 806 and 808. The analog-to-digital converters 806 and 808 have the same circuit structure as that of the analog-to-digital converter 604 shown in FIG. 5. In addition, the analog-to-digital converters 806 and 808 are coupled in series. The microphone 802 detects a sound pressure to generate an analog audio signal Sb. A pre-amplifier 812 amplifies the analog audio signal Sb to obtain an amplified audio signal Sb', a ΔΣ modulator 814 converts the amplified audio signal Sb' from analog to digital to obtain a digital audio signal Sb", and a signal coding module 816 then encodes a coded audio signal Db according to the digital audio signal Sb". Because the input terminal of a channel selection signal of the analog-to-digital converter 806 is coupled to a logic high level of a voltage source Vdd, a toggle detection module 818 determines that the channel selection signal is not toggling, and a multiplexer 826 therefore outputs the data bits of the coded audio signal Db as an output signal of the analog-to-digital converter 806 when the clock signal CLK oscillates to a logic high level.

The microphone 804 detects a sound pressure to generate an analog audio signal Sa. A pre-amplifier 852 amplifies the analog audio signal Sa to obtain an amplified audio signal Sa', a ΔΣ modulator 854 converts the amplified audio signal Sa' from analog to digital to obtain a digital audio signal Sa", and a signal coding module 856 then encodes a coded audio signal Da according to the digital audio signal Sa". After the input terminal of a channel selection signal of the analog-to-digital converter 808 receives the digital output signal Db of the analog-to-digital converter 806, the data processing module 860 then processes the digital output signal Db to generate a channel selection signal Db', and the phase module 862 then inverts the phase of the channel selection signal Db' to generate a channel selection signal Db". Because a toggle detection module 858 determines that the channel selection signal Db is toggling, a multiplexer 866 therefore outputs the data bits of the channel selection signal Db" as an output signal of the analog-to-digital converter 808 when the clock signal CLK oscillates to a logic low level, and outputs the data bits of the coded audio signal Da as the output signal of the analog-to-digital converter 808 when the clock signal CLK oscillates to a logic high level. In other words, the output signal of the analog-to-digital converter 808 comprises the data bits of digital audio signals Da and Db" respectively derived from analog audio signals Sa and Sb. The output signal of the analog-to-digital converters 808 is then taken as an output datastream of the sound processing device 800.

Figure 8:
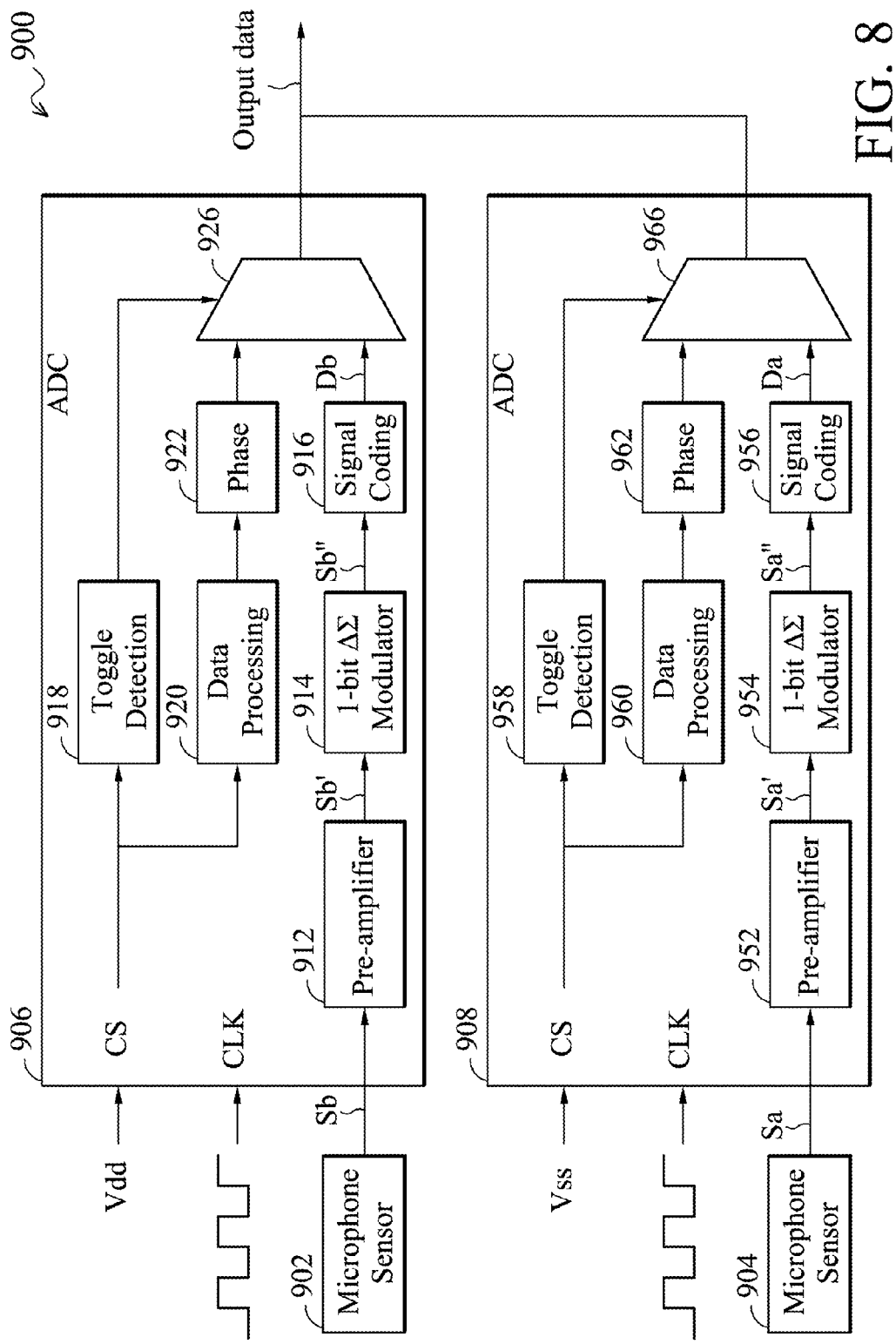
FIG. 8 is a block diagram of another embodiment of a sound processing device according to the invention.

Referring to FIG. 8, a block diagram of another embodiment of a sound processing device 900 according to the invention is shown. In one embodiment, the sound processing device 900 comprises two microphones 902 and 904 and two analog-to-digital converters 906 and 908. The analog-to-digital converters 906 and 908 have the same circuit structure as that of the analog-to-digital converter 604 shown in FIG. 5. In addition, the analog-to-digital converters 906 and 908 are coupled in parallel. The microphone 902 detects a sound pressure to generate an analog audio signal Sb. A pre-amplifier 912 amplifies the analog audio signal Sb to obtain an amplified audio signal Sb', a ΔΣ modulator 914 converts the amplified audio signal Sb' from analog to digital to obtain a digital audio signal Sb", and a signal coding module 916 then encodes a coded audio signal Db according to the digital audio signal Sb". Because the input terminal of a channel selection signal of the analog-to-digital converter 906 is coupled to a logic high level of a voltage source Vdd, a toggle detection module 918 determines that the channel selection signal is not toggling, and a multiplexer 926 therefore outputs the data bits of the coded audio signal Db as an output signal of the analog-to-digital converter 906 when the clock signal CLK oscillates to a logic high level.

The microphone 904 detects a sound pressure to generate an analog audio signal Sa. A pre-amplifier 952 amplifies the analog audio signal Sa to obtain an amplified audio signal Sa', a ΔΣ modulator 954 converts the amplified audio signal Sa' from analog to digital to obtain a digital audio signal Sa", and a signal coding module 956 then encodes a coded audio signal Da according to the digital audio signal Sa". Because the input terminal of a channel selection signal of the analog-to-digital converter 908 is coupled to a logic low level of a voltage source Vss, a toggle detection module 958 determines that the channel selection signal is not toggling, and a multiplexer 966 therefore outputs the data bits of the coded audio signal Da as an output signal of the analog-to-digital converter 908 when the clock signal CLK oscillates to a logic low level. The data bits of output signals Da and Db of the analog-to-digital converters 906 and 908 are then combined to form an output datastream of the sound processing device 900.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital converter, receiving a first audio signal from a microphone sensor, receiving a first channel selection signal and a clock signal, comprising:
   a toggle detection module, detecting whether the first channel selection signal is toggling between a logic low level and a logic high level to generate a control signal;
   a first data processing module, processing the first channel selection signal to generate a second channel selection signal;
   a phase module, inverting the phase of the second channel selection signal to generate a third channel selection signal;
   a second data processing module, converting the first audio signal from analog to digital to generate a second audio signal; and
   a multiplexer, if the control signal indicates that the first channel selection signal is toggling between the logic low level and the logic high level, outputting data bits of the third channel selection signal as an output signal of the analog-to-digital converter when the clock signal oscillates to the logic high level, and outputting data bits of the second audio signal as the output signal of the analog-to-digital converter when the clock signal oscillates to the logic low level.

2. The analog-to-digital converter as claimed in claim 1, wherein the second data processing module comprises:
   a pre-amplifier, amplifying the first audio signal to obtain a third audio signal;
   a 1-bit ΔΣ modulator, converting the third audio signal from analog to digital to obtain a fourth audio signal; and
   a signal coding module, encoding the second audio signal according to the fourth audio signal when the control signal indicates that the first channel selection signal is toggling, and bypassing the fourth audio signal as the second audio signal when the control signal indicates that the first channel selection signal is not toggling.

3. The analog-to-digital converter as claimed in claim 1, wherein if the control signal indicates that the first channel selection signal stays at the logic low level, the multiplexer outputs the data bits of the second audio signal as the output signal of the analog-to-digital converter when the clock signal oscillates to the logic low level, and the output terminal of the analog-to-digital converter is switched to a high-impedance state when the clock signal oscillates to the logic high level.

4. The analog-to-digital converter as claimed in claim 1, wherein if the control signal indicates that the first channel selection signal stays at the logic high level, the multiplexer outputs the data bits of the second audio signal as the output signal of the analog-to-digital converter when the clock signal oscillates to the logic high level, and the output terminal of the analog-to-digital converter is switched to a high-impedance state when the clock signal oscillates to the logic low level.

5. The analog-to-digital converter as claimed in claim 2, wherein the signal coding module adds a DC offset value to the fourth audio signal to obtain the second audio signal.

6. The analog-to-digital converter as claimed in claim 2, wherein the signal coding module multiplies the fourth audio signal by a multiplier value to obtain the second audio signal.

7. The analog-to-digital converter as claimed in claim 2, wherein the signal coding module delays the fourth audio signal by a delay period to obtain the second audio signal.

8. A sound processing device, comprising:
   a first microphone, detecting a first sound pressure to generate a first analog audio signal;
   a first analog-to-digital converter, converting the first analog audio signal from analog to digital to obtain a first digital audio signal;
   a second microphone, detecting a second sound pressure to generate a second analog audio signal; and
   a second analog-to-digital converter, receiving the first digital audio signal and a clock signal, inverting the phase of the first digital audio signal to generate a third digital audio signal, converting the second analog audio signal from analog to digital to obtain a second digital audio signal, encoding a fourth digital audio signal according to the second digital audio signal, outputting data bits of the third digital audio signal when the clock signal oscillates to a logic low level, and outputting data bits of the fourth digital audio signal when the clock signal oscillates to a logic high level.

9. The sound processing device as claimed in claim 8, wherein the second analog-to-digital converter comprises:
   a toggle detection module, detecting whether the first digital audio signal is toggling between the logic low level and the logic high level to generate a control signal;
   a first data processing module, processing the first digital audio signal to generate a fifth digital audio signal;
   a phase module, inverting the phase of the fifth digital audio signal to generate the third digital audio signal;
   a second data processing module, converting the second analog audio signal from analog to digital to obtain the second digital audio signal, and encoding the fourth digital audio signal according to the second digital audio signal; and
   a multiplexer, if the control signal indicates that the first digital audio signal is toggling between the logic low level and the logic high level, outputting data bits of the third digital audio signal as an output signal of the analog-to-digital converter when the clock signal oscillates to the logic low level, and outputting data bits of the fourth digital audio signal as the output signal of the analog-to-digital converter when the clock signal oscillates to the logic high level.

10. The sound processing device as claimed in claim 9, wherein the second data processing module comprises:
    a pre-amplifier, amplifying the second analog audio signal to obtain a third analog audio signal;
    a 1-bit ΔΣ modulator, converting the third analog audio signal from analog to digital to obtain the second digital audio signal; and
    a signal coding module, encoding the fourth digital audio signal according to the second digital audio signal.

11. The sound processing device as claimed in claim 8, wherein the second analog-to-digital converter encodes the fourth digital audio signal by adding a DC offset value to the second digital audio signal.

12. The sound processing device as claimed in claim 8, wherein the second analog-to-digital converter encodes the fourth digital audio signal by multiplying the second digital audio signal by a multiplier.

13. The sound processing device as claimed in claim 8, wherein the second analog-to-digital converter encodes the fourth digital audio signal by delaying the second digital audio signal by a delay period.

14. An analog-to-digital conversion method, wherein an analog-to-digital converter comprises a toggle detection module, a first data processing module, a phase module, a second data processing module, and a multiplexer, comprising:
    receiving a first audio signal from a microphone sensor;
    receiving a first channel selection signal and a clock signal;

detecting whether the first channel selection signal is toggling between a logic low level and a logic high level with a toggle detection module to generate a control signal;

processing the first channel selection signal with the first data processing module to generate a second channel selection signal;

inverting the phase of the second channel selection signal to generate a third channel selection signal;

converting the first audio signal from analog to digital with the second data processing module to generate a second audio signal; and if the control signal indicates that the first channel selection signal is toggling between the logic low level and the logic high level, outputting data bits of the third channel selection signal with the multiplexer as an output signal of the analog-to-digital converter when the clock signal oscillates to the logic low level, and outputting data bits of the second audio signal with the multiplexer as the output signal of the analog-to-digital converter when the clock signal oscillates to the logic high level.

* * * * *